US006621744B2

(12) United States Patent
Kojima

(10) Patent No.: US 6,621,744 B2
(45) Date of Patent: Sep. 16, 2003

(54) READABLE SEMICONDUCTOR MEMORY DEVICE

(75) Inventor: Makoto Kojima, Osaka (JP)

(73) Assignee: Matshushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/140,803

(22) Filed: May 7, 2002

(65) Prior Publication Data

US 2002/0167853 A1 Nov. 14, 2002

(30) Foreign Application Priority Data

May 9, 2001 (JP) ...................................... 2001-139386

(51) Int. Cl.[7] .............................................. G11C 16/06
(52) U.S. Cl. .................... 365/185.23; 365/202; 365/210
(58) Field of Search ................................. 365/203, 202, 365/205, 207, 208, 185.25, 185.23, 210, 185.2

(56) References Cited

U.S. PATENT DOCUMENTS 5,590,073 A * 12/1996 Arakawa et al. ........ 365/185.08
6,449,201 B1 * 9/2002 Kojima ....................... 365/205

FOREIGN PATENT DOCUMENTS

JP  2001-167591  12/1999

OTHER PUBLICATIONS

M. Hiraki et al., "A 3.3V 90MHz Flash Memory Module Embedded in a 32b RISC Microcontroller," Feb. 1999, ISSCC Digest of Technical Papers, pp. 116–117, 453.

* cited by examiner

Primary Examiner—David Nelms
Assistant Examiner—Gene N. Auduong
(74) Attorney, Agent, or Firm—RatnerPrestia

(57) ABSTRACT

In a semiconductor memory device, a first input end and a main bit line are precharged to a first voltage, and a sub-bit line is reset to a second voltage. Thereafter, a portion of the electric charge precharged in the first input end and the main bit line is redistributed to the sub-bit line. In this read method, until after potential inversion occurs between the main bit line and a complementary main bit line, the time of activating a selection gate is delayed from the times of activating a word line and a reference word line. Therefore, performance of an accurate sense operation can be secured, so that information can be accurately read from the memory cells without error.

12 Claims, 6 Drawing Sheets

READABLE SEMICONDUCTOR MEMORY DEVICE

BACKGROUND OF THE INVENTION

1. Field of the Invention

The present invention relates to a semiconductor memory device which is at least readable.

2. Description of the Related Art

Recently, there has been a demand for a high-speed microcomputer having an operating speed corresponding to more than 100 MHz. As the operating speed of a microcomputer is increased, a higher operating speed is required for a ROM and flash memory mounted on the same chip on which the microcomputer is mounted. The ROM and flash memory are mounted on a chip typically for the purposes of customization.

Moreover, a memory having a higher capacity is required with an increase in the performance recent microcomputers.

In this situation, a large-capacity semiconductor memory device from which data can be read at a high speed has been researched and developed. For example, Japanese Patent Application No. 11-349301 proposes a semiconductor memory device having a hierarchical bit line architecture. Similarly, Mitsuru Hiraki et al. "ISSCC99/SESSION6/PAPER MP6.8 (A3.3V 90 MHz • Flash Memory Module Embedded in a 32b RISC Microcontroller)", Feb. 15, 1999, proposes a sense-type semiconductor memory device having a high readout speed.

In the semiconductor memory device disclosed in the above-described publication, both a global bit line (corresponding to a main bit line) and a local bit line (corresponding to a sub-bit line) are discharged to a ground level in advance; a global bit line and local bit line corresponding to a read address is selected; and precharging the selected global and local bit lines is initiated. During the precharging step (before precharge is completed), a sense operation is conducted. As is different from previous techniques, both a global bit line and a local bit line are discharged to a ground level, so that an influence of the potentials of the global and local bit lines in a previous readout operation is eliminated and a sense operation can be carried out during the precharging step.

However, since the rate of precharging is substantially half the cell current, a potential difference between a readout side and a reference side is not present until the current driving performance of a memory cell becomes full, i.e., a local sub-bit line (local bit line) is charged to a certain potential. Therefore, a sense operation can be initiated during a precharging operation only after a local sub-bit line (local bit line) has been charged to a certain potential.

Also, for example, the semiconductor memory device disclosed in Japanese Patent Application No. 11-349301 comprises an information readout section, a reference section, a differential sense amplifier which receives information outputs from the information readout section and the reference section, and a control section which controls each section.

The information readout section has a sub-bit line connected via a selection gate to a main bit line, a plurality of memory cells connected to the sub-bit line, which are selectively activated in response to the voltage of a word line, a precharge section which precharges the main bit line and a main bit line at the input end side of the differential sense amplifier, and a reset section which resets the sub-bit line side to the ground potential.

The control section controls the precharge section so as to achieve high-speed information readout as follows. The main bit line and the main bit line at the input end side of the differential sense amplifier are precharged. The reset section is controlled in a manner that sets the sub-bit line side to the ground potential. Thereafter, a portion of the electric charge precharged at the main bit line and the main bit line at the input end side of the differential sense amplifier is redistributed to the sub-bit line side by controlling the selection gate.

However, in the above-described semiconductor memory device, voltages are not simultaneously applied to gates due to differences in load capacity among a word line, a reference word line, and a selection gate control line (in the case of a non-volatile memory, due to differences in devices due to differences in voltage systems). In the case of a non-volatile memory, a voltage is generally applied to a word line by a driver in a high voltage system. Therefore, once an address has been determined, a word line actually goes high slower than a reference word line and a selection gate. Since a word line, a reference word line, and a selection gate control line do not simultaneously go high, it is difficult to accurately read information from the memory cells.

For example, it is assumed that the reference section side is earlier connected to the input end side of the differential sense amplifier and a flow of reference current begins, while a flow of current occurs later in a cell in which a current inherently flows at the information readout section side. In this case, the reference section side of the main bit line initially has a lower voltage than that of the reference section side thereof, and thereafter, the readout side thereof is lowered, so that the reference section side of the main bit line initially has a higher voltage than that of the readout side thereof. Therefore, when a sense operation is activated, since voltages are not simultaneously applied to a word line and a reference word line, an information read operation is not likely to be performed accurately.

SUMMARY OF THE INVENTION

According to one aspect of the present invention, a semiconductor memory device comprises memory cells, reference cells, sub-bit lines, at least the memory cells or the reference cells being connected to the sub-bit lines, a first selection gate, a second selection gate, a main bit line, the sub-bit lines being connected via the first selection gate to the main bit line, complementary sub bit lines, at least the other of the memory cells and the reference cells being connected to the complementary sub-bit line, a complementary main bit line, the complementary sub-bit lines being connected via the second selection gate to the complementary main bit line, word lines corresponding to the memory cells, reference word lines corresponding to the reference cells, a word line driving section for selectively activating at least one of the word lines, a reference word line driving section for selectively activating at least one of the reference word lines, and a control section for outputting a selection gate signal to the first and second selection gates, the selection gate signal activating the first and second selection gates, the time of activating the first and second selection gates being delayed from the time of activating the word lines and the reference word lines to an extent that potential inversion does not occur between the main bit line and the complementary main bit line. Information is read from the memory cells via the main bit line and the complementary main bit line.

With this configuration, until after potential inversion occurs between a main bit line and a complementary main bit line due to a time lag between a word line and a reference word line, the time of activating a selection gate is delayed from the times of activating a word line and a reference word line. Therefore, performance of an accurate sense operation can be secured, so that information can be accurately read from memory cells without error.

In one embodiment of this invention, the semiconductor memory device further comprises a differential sense amplifier comprising first and second input ends, for sensing a difference in voltage between the first and second input ends, a precharge section for precharging the main bit line and the complementary main bit line to a first voltage, and a reset section for resetting the sub-bit lines and the complementary sub-bit lines to a second voltage lower than the first voltage, and releasing the reset state of one of the sub-bit lines and releasing the reset state of one of the complementary sub-bit lines. The main bit line is connected to the first input end, the complementary main bit line is connected to the second input end, the first selection gate selectively connects the main bit line to one of the sub-bit lines, and the second selection gate selectively connects the complementary main bit line to one of the complementary sub-bit lines. The control section controls the differential sense amplifier, the precharge section, the reset section, and the selection gate section so that the main bit line and the complementary main bit line are precharged to the first voltage, the sub-bit lines and the complementary sub-bit lines are reset to the second voltage in advance, and after selectively releasing the reset state of one of the sub-bit lines and one of the complementary sub-bit lines, a portion of electric charge precharged in the main bit line is redistributed to the reset-state released sub-bit line via the first selection gate, and a portion of electric charge in the complementary main bit line is redistributed to the reset-state released complementary sub-bit line via the second selection gate, and thereafter a sense operation is performed.

With this configuration, the selection gate of the present invention can be easily controlled in this array arrangement.

In one embodiment of this invention, the semiconductor memory device further comprises a differential sense amplifier comprising first and second input ends, for sensing a difference in voltage between the first and second input ends, a first separation gate for connecting or disconnecting the first input end and the main bit line, a second separation gate for connecting or disconnecting the second input end and the main bit line, the complementary main bit line being connected via the second separation gate to the second input end, a precharge section for precharging the main bit line and the complementary main bit line to a first voltage, and a reset section for resetting the sub-bit lines and the complementary sub-bit lines to a second voltage lower than the first voltage, and releasing the reset state of one of the sub-bit lines and releasing the reset state of one of the complementary sub-bit lines. The main bit line is connected via the first separation gate to the first input end, the first selection gate selectively connects the main bit line to one of the sub-bit lines, and the second selection gate selectively connects the complementary main bit line to one of the complementary sub-bit lines. The control section controls the precharge section, the reset section, and the selection gate section so that the main bit line and the complementary main bit line are precharged to the first voltage, the sub-bit lines and the complementary sub-bit lines are reset to the second voltage in advance, and after selectively releasing the reset state of one of the sub-bit lines and one of the complementary sub-bit lines, a portion of electric charge precharged in the main bit line is redistributed to the reset-state released sub-bit line via the first selection gate, and a portion of electric charge in the complementary main bit line is redistributed to the reset-state released complementary sub-bit line via the second selection gate, and thereafter a sense operation is performed, and thereafter, at the same time as or immediately after initiating a sense operation of the differential sense amplifier, the control section controls the first separation gate to disconnect the first input end and the main bit line and the second separation gate to disconnect the second input end and the complementary main bit line, and disables the first and second selection gate so that the main bit line and the complementary bit line are precharged, and the sub-bit line and the complementary bit line are discharged.

With this configuration, the differential sense amplifier is separated from the main bit line by the first and second separation gates, so that a sense operation and precharge and discharge operations can be performed in parallel. Therefore, high-speed information reading can be obtained.

In one embodiment of this invention, a plurality of subarrays are arranged in a direction along the main bit line and the complementary main bit line. Each subarray comprises a memory cell array comprising the memory cells, a reference cell array comprising the reference cells, the reset section, and the selection gate section.

With this configuration, the selection gate switching control arrangement of this invention can be easily applied to a semiconductor memory device comprising a plurality of subarrays.

In one embodiment of this invention, at least one of the memory cells and at least one of the reference memory cells are connected to each sub-bit line, and at least one of the memory cells and at least one of the reference memory cells are connected to each complementary sub-bit line.

With this configuration, the selection gate switching control arrangement of this invention can be easily applied to a semiconductor memory device comprising sub-bit lines and complementary sub-bit lines and a plurality of subarrays to which memory cells and reference cells are connected.

In one embodiment of this invention, connecting the main bit line to the sub-bit lines via the first selection gate and connecting the complementary main bit line to the complementary sub-bit lines via the second selection gate are performed in response to a scanning signal for selecting the word lines or an address signal to be decoded to the scanning signal.

With this configuration, the selection gate can be easily controlled in the array arrangement. When the delay time of a signal is determined using a signal (scanning signal) from a system in which a signal is delayed, the time of activating the selection gate is securely delayed from the time of activating the word line.

In one embodiment of this invention, the control section determines the time of activating the differential sense amplifier for a sense operation in response to the scanning signal from the word line driving section or the address signal to be decoded to the scanning signal.

With this configuration, a sense time can be easily and stably determined or adjusted by using a signal output from the selection gate controlled by receiving a scanning signal or an address signal to be decoded to the scanning signal.

In one embodiment of this invention, the first and second selection gates each comprise a first-stage selection gate and a plurality of second-stage selection gates, the first selection gate is provided between the main bit line and the sub-bit lines and the second selection gate is provided between the complementary main bit line and the complementary sub-bit lines, the plurality of second-stage selection gates are hierarchically branched from the first-stage selection gate, and the control section deliberately delays the time of switching on the first-stage selection gate.

With this configuration, when the two-stage selection gates are hierarchically provided, the timing of delay is adjusted in the selection gate at the main bit line side. Before this, it is possible to effectively reset between the first and second selection gates.

In one embodiment of this invention, the first and second selection gates each comprise a first-stage selection gate and a plurality of second-stage selection gates, the first selection gate is provided between the main bit line and the sub-bit lines and the second selection gate is provided between the complementary main bit line and the complementary sub-bit lines, the plurality of second-stage selection gates are hierarchically branched from the first-stage selection gate, and the control section switches on the second-stage selection gates a predetermined time earlier than that of the first-stage selection gate, and after a predetermined time, switches off the first-stage selection gate earlier than that of the second-stage selection gates.

With this configuration, when the two-stage selection gates are hierarchically provided, the selection gate at the main bit line side is earlier closed, and after discharging, the selection gate at the sub-bit line side is cut off.

In one embodiment of this invention, the control section has a canceling section for canceling information reading, and the canceling section prohibits control of switching on the first and second selection gates.

With this configuration, an abort process is prepared so that the selection gate can be canceled at high speed. When information read is canceled partway, a memory operation has to be resumed from a precharge operation, resulting in access penalty. This access penalty when canceling an information read operation is reduced.

Thus, the invention described herein makes possible the advantages of providing a semiconductor memory device in which an accurate sense operation is performed without improper reading of information.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings. Particularly, the present invention is applied to a non-volatile semiconductor memory device in the following examples.

EXAMPLE 1

Figure 1:
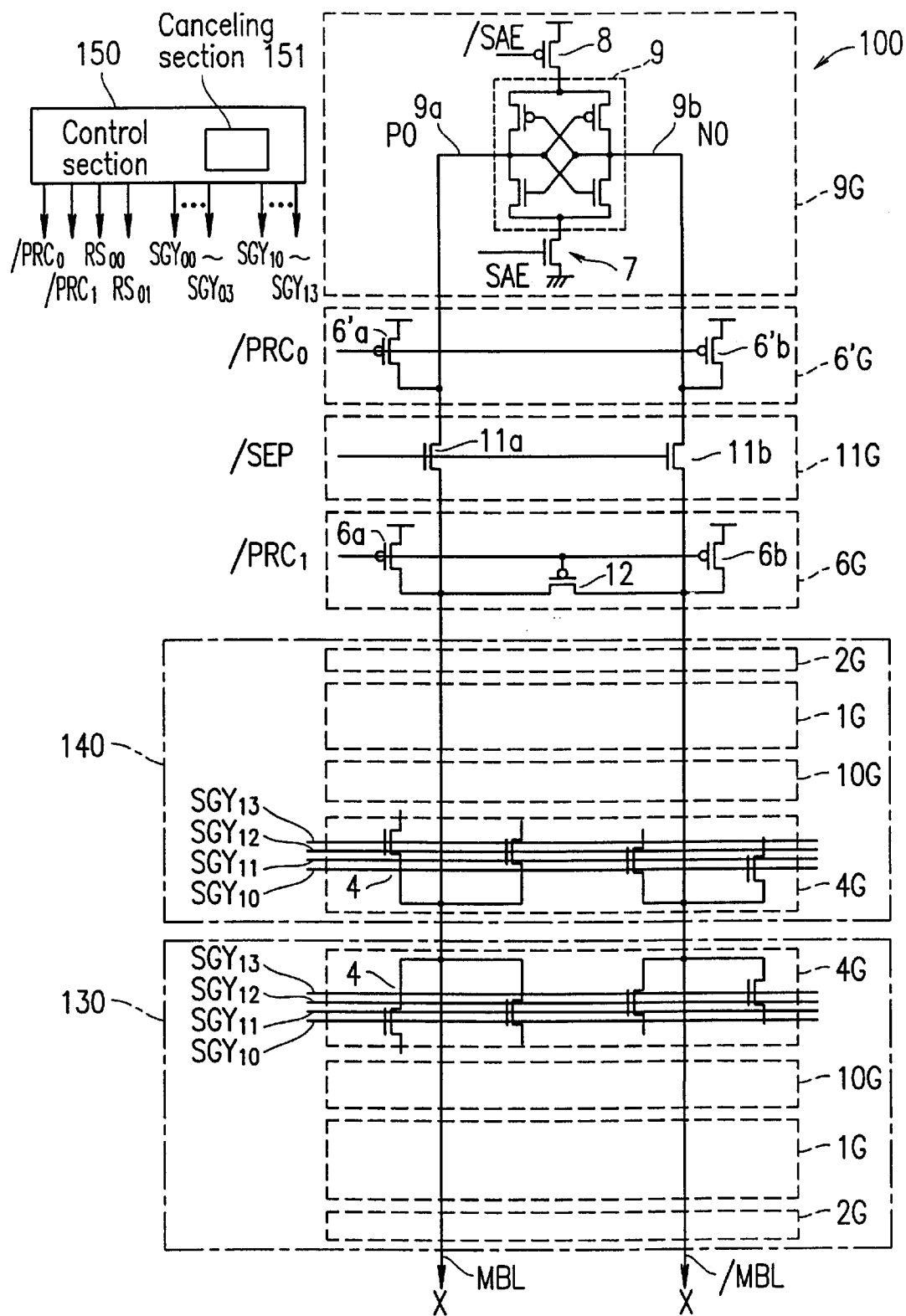
FIG. 1 is a circuit diagram showing a major portion of a configuration of a semiconductor memory device according to Example 1 of the present invention.
Figure 2:
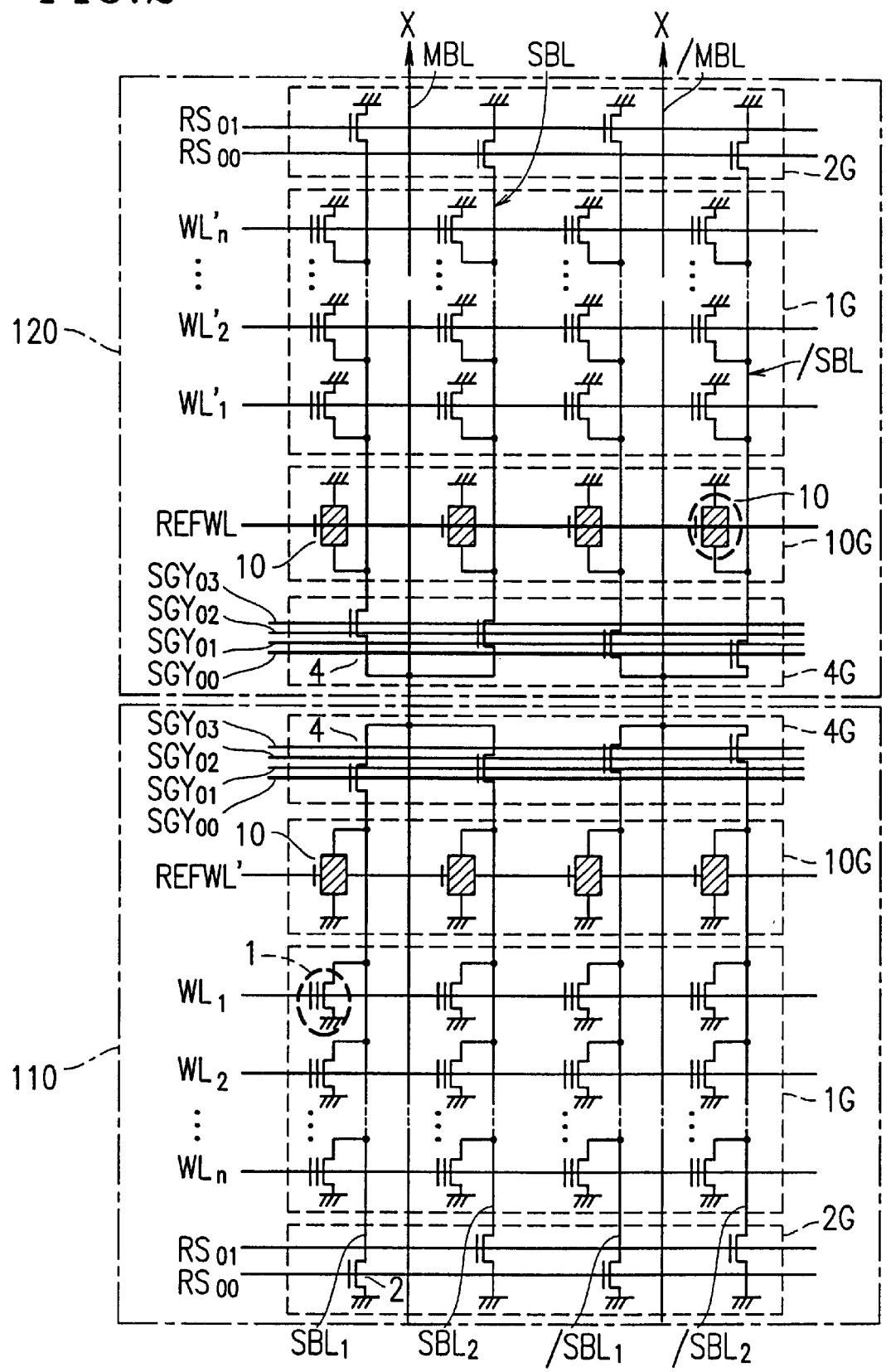
FIG. 2 is a circuit diagram showing another major portion of the configuration of the semiconductor memory device of Example 1.

FIGS. 1 and 2 are circuit diagrams showing configurations of major portions of a semiconductor memory device 100 according to Example 1 of the present invention. In FIGS. 1 and 2, the semiconductor memory device 100 comprises a differential sense amplifier section 9G, precharge sections 6'G and 6G, a separation gate portion 11G, a plurality of subarrays 110 through 140, a control section 150 for controlling the above-described sections so as to perform memory control, such as data read and the like, and a word line decoder circuit (not shown) for controlling the memory cells.

The differential sense amplifier section 9G is provided with a differential sense amplifier 9 between a transistor 7 at the ground side and a transistor 8 at the power source side. In the differential sense amplifier 9, the transistors 7 and 8 are activated by sense activation signals SAE and /SAE, respectively, and a voltage difference between a first input end 9a (P0) and a second input end 9b (N0) is sensed.

The separation gate portion 11G has main bit line separation gates 11a and 11b provided between the precharge sections 6'G and 6G. The input end 9a is connected or disconnected to a main bit line MBL by use of the main bit line separation gate 11a. Further, the input end 9b is connected or disconnected to a complementary main bit line /MBL by use of the main bit line separation gate 11b.

The precharge section 6'G has Pch transistors 6'a and 6'b which are switched on and off in response to a precharge signal /PRC$_0$. The precharge section 6'G precharges the input ends 9a and 9b to a power source voltage Vdd (first voltage) via the transistors 6'a and 6'b, respectively.

The precharge section 6G has Pch transistors 6a and 6b which are switched on and off in response to a precharge signal /PRC$_1$, and an equalization transistor 12. The precharge section 6G precharges the main bit line MBL and the complementary main bit line /MBL to the power source voltage Vdd (first voltage) via the transistors 6a and 6b, respectively.

The subarrays 110 through 140 each have: a memory cell array 1G including a plurality of memory cells 1; a reset section 2G for resetting a plurality of sub-bit lines SBL$_1$ and SBL$_2$ and a plurality of complementary sub-bit lines /SBL$_1$ and /SBL$_2$ to a ground voltage Vss (second voltage), which is lower than the first voltage (Vdd), via a transistor 2 in advance and selectively releases the reset state of one of the sub-bit lines SBL$_1$ and SBL$_2$ and one of the complementary sub-bit lines /SBL$_1$ and /SBL$_2$; a selection gate section 4G for selectively connecting the main bit line MBL to one of a plurality of sub-bit lines SBL$_1$ and SBL$_2$ (two in FIG. 2) and selectively connecting the complementary main bit line /MBL to one of the complementary sub-bit lines /SBL$_1$ and /SBL$_2$ (two in FIG. 2); and a reference cell array 10G including a plurality of reference cells 10.

In each of the subarrays 110 through 140, the main bit line MBL and the complementary main bit line /MBL are arranged in their extending directions, and an array of the sub-bit lines SBL$_1$ and SBL$_2$ and the sub-bit lines /SBL$_1$ and /SBL$_2$ branched from the main bit line MBL and the complementary main bit line /MBL, respectively, is provided. Word lines WL, reference word lines REFWL, and reset signal lines RS$_{00}$ and RS$_{01}$ are controlled in such a manner that the sub-bit lines SBL$_1$ and SBL$_2$ function as an information read section at the read bit cell side, and as a reference section at the reference cell side. Similarly, word lines WL', reference word lines REFWL', and the reset signal lines $RS_{00}$ and $RS_{01}$ are controlled in such a manner that the sub-bit lines $/SBL_1$ and $/SBL_2$ function as an information read section at the read bit cell side, and as a reference section at the reference cell side.

For example, the subarray 120 has the same configuration as that of the subarray 110. However, the memory cells 1 in the subarray 110 are selectively activated by the voltages of corresponding word lines of the word lines $WL_1$ through $WL_n$, while the memory cells 1 in the subarray 120 are selectively activated by the voltages of corresponding word lines of the word lines $WL'_1$ through $WL'_n$. Further, the reference cells 10 in the subarray 110 are each selectively activated by the voltage of the respective reference word line REFWL', the reference cells 10 in the subarray 120 are each selectively activated by the voltage of the respective reference word line REFWL.

At least the memory cell(s) 1 or the reference cell(s) 10 is connected to each of the sub-bit lines $SBL_1$ and $SBL_2$, while at least the other of the memory cell(s) 1 and the reference cell(s) 10 is connected to each of the complementary sub-bit lines $/SBL_1$ and $/SBL_2$. When one of the memory cells 1 in the subarray 110 is selected, one of the reference cells 10 in the subarray 120 is selected. Conversely, when one of the memory cells 1 in the subarray 120 is selected, one of the reference cells 10 in the subarray 110 is selected. Thus, the subarray 110 and the subarray 120 are complementarily operated.

The subarrays 130 and 140 also have the same configuration as that of the subarrays 110 and 120, and the description thereof is simplified and the configurations of the subarrays 130 and 140 shown in FIG. 1 are simplified. The subarrays 130 and 140 are also complementarily operated, similar to the subarrays 110 and 120.

The control section 150 outputs control signals, such as the sense activation signals SAE and /SAE, the precharge signal $/PRC_0$ and $/PRC_1$, the reset signals $RS_{00}$ and $RS_{01}$, selection gate signals $SGY_{00}$ through $SGY_{03}$ and $SGY_{10}$ through $SGY_{13}$, and the like so as to control the differential sense amplifier 9, the precharge sections 6'G and 6G, the subarrays 110 through 140, and the like.

Specifically, the control section 150 controls the precharge section 6G and the subarrays 110 through 140 so as to precharge the main bit line MBL and the complementary main bit line /MBL to the power source voltage Vdd, resetting the sub-bit lines $SBL_1$ and $SBL_2$ and the complementary sub-bit lines $/SBL_1$ and $/SBL_2$ to a power source voltage Vss in advance, selectively releasing the reset state of one of the sub-bit line $SBL_1$ and $SBL_2$ and one of the complementary sub-bit lines $/SBL_1$ and $/SBL_2$, redistributing a portion of the electric charge precharged at the main bit line MBL to the selectively reset-state released sub-bit line via the selection gate 4, and redistributing a portion of the electric charge precharged at the complementary main bit line /MBL to the selectively reset-state released complementary sub-bit line via the selection gate(s) 4.

Further, the control section 150 has a section for controlling the selection gates as a feature of the present invention. Such a section outputs the selection gate signals $SGY_{00}$ through $SGY_{03}$ so that the time of the selection gate(s) 4 controlling connections between the main bit line MBL and the sub-bit line SBL and between the complementary main bit line /MBL and the complementary sub-bit line /SBL is deliberately delayed from the time of activating the word lines $WL_1$ through $WL_n$ and the reference word lines REFWL to prevent potential inversion between the main bit line MBL and the complementary main bit line /MBL. Such a delay time needs to be greater than or equal to a delay time of activation of the word line WL from activation of the reference word line REFWL and greater than or equal to a delay time sufficient for the potential inversion between the main bit line MBL and the complementary main bit line /MBL.

Further, the control section 150 controls switching to the selection gate(s) 4 at the read side and the selection gate(s) 4 at the complementary side. This switching control may be performed by a scanning signal from a word line decoder circuit (not shown) for selecting and controlling the word lines WL at the read side, or an address signal for decoding the scanning signal input to the word line decoder circuit (not shown). Specifically, the control section 150 may receive the scanning signal (word line driving signal) from the word line decoder circuit (not shown), and determine the time of switching on the selection gate(s) 4 (the time of outputting the selection gate signal). Alternatively, the control section 150 may receive the address signal input to the word line decoder circuit (not shown), and determine the time of switching on the selection gate(s) 4 (the time of outputting the selection gate signal).

The word line decoder circuit (not shown) has a word line driving section (not shown) for selectively activating the word lines $WL_1$ through $WL_n$ and $WL'_1$ through $WL'_n$ corresponding to the memory cells 1, and a reference word line driving section (not shown) for selectively activating the reference word lines REFWL and REFWL' corresponding to the reference cells 10.

It should be noted that in the exemplary circuit shown in FIGS. 1 and 2, the number of subarrays is four, but is not limited thereto. The semiconductor memory device 100 may have an arbitrary number of subarrays. Further, in the exemplary circuit shown in FIGS. 1 and 2, one subarray includes two sub-bit lines SBL and two complementary sub-bit lines /SBL, but the numbers of the sub-bit lines SBL and the complementary sub-bit lines /SBL may be more than two. The semiconductor memory device 100 may have an arbitrary number of sub-bit lines SBL and complementary sub-bit lines /SBL.

In the semiconductor memory device 100 having the above-described subarray configuration, the main bit lines MBL and the complementary main bit lines /MBL are symmetrically arranged while the sub-bit lines $SBL_1$ and $SBL_2$ and the complementary sub-bit lines $/SBL_1$ and $/SBL_2$ are symmetrically arranged. Therefore, the capacitance value Cm of the main bit lines MBL is substantially equal to the capacitance value Cm' of the complementary main bit lines /MBL, while the capacitance value Cs of the sub-bit lines $SBL_1$ and $SBL_2$ is substantially equal to the capacitance value Cs' of the complementary sub-bit line $/SBL_1$ and $/SBL_2$. As described above, the control section 150 connects the memory cells 1 to the main bit lines MBL and connects the reference cells 10 to the complementary main bit lines /MBL. Alternatively, the memory cells 1 may be connected to the complementary main bit lines /MBL, while the reference cells 10 may be connected to the main bit lines MBL. In this case, the time of activating the selection gates 4 so as to connect between the main bit lines MBL and the sub-bit lines SBL and between the complementary main bit lines /MBL and the complementary sub-bit lines /SBL is delayed from the time of activating the word lines WL (or WL') and the reference word lines REFWL (or REFWL') within a range that potential inversion does not occur, and selection gate signals are output to the respective selection gates 4.

An operation of the thus-constructed semiconductor memory device 100 will be described below.

Figure 3:
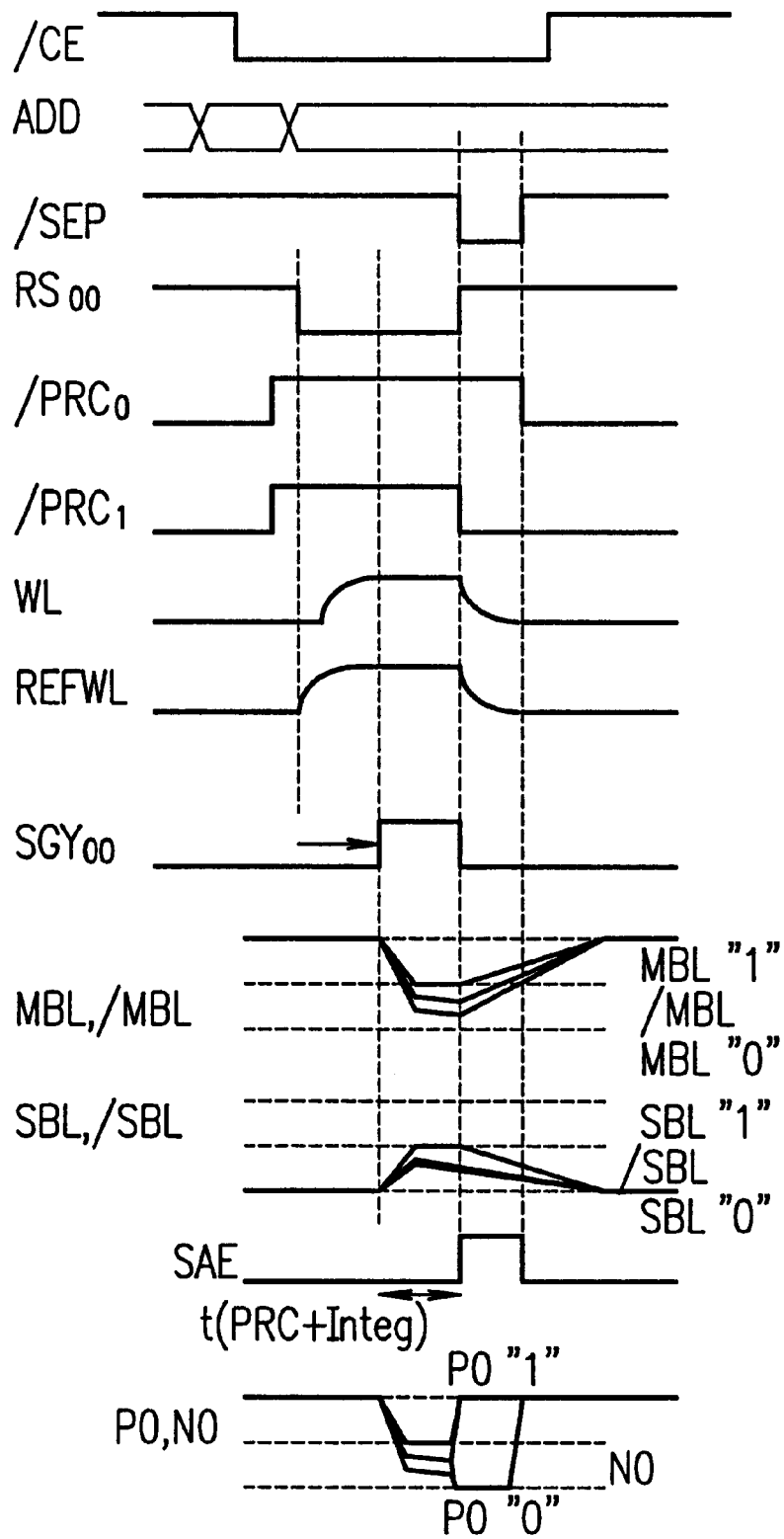
FIG. 3 is a timing chart of signals of major portions of the semiconductor memory device of FIGS. 1 and 2.

FIG. 3 is a timing chart showing a signal from each portion of the semiconductor memory device 100 shown in FIGS. 1 and 2.

As shown in FIG. 3, initially, the input ends 9a and 9b of the differential sense amplifier 9, the main bit lines MBL, and the complementary main bit lines /MBL are precharged to the power source voltage Vdd. The sub-bit lines $SBL_1$ and $SBL_2$ and the complementary sub-bit lines /$SBL_1$ and /$SBL_2$ are reset to the ground voltage Vss.

In this situation, the control section 150 inactivates the precharge signals /$PRC_0$ and /$PRC_1$ in response to the falling edge of a chip enable signal /CE. Thereby, the precharging of the input ends 9a and 9b, the main bit lines MBL, the complementary main bit lines /MBL are ended.

Thereafter, two of the subarrays 110 through 140, which are complementary to each other, are selected in response to an address signal ADD. In this case, it is assumed that the subarrays 110 and 120 are selected. Further, it is assumed that in response to the address signal ADD, the selection gate signal line $SGY_{00}$, the word line $WL_1$, and the reference word line REFWL are selected, and sub-bit line reset signal $RS_{00}$ goes from a high level to a low level. It should be noted that the sub-bit line reset signal $RS_{01}$ is maintained at the high level. In this case, memory cells 1 in the subarray 110 and reference cells 10 in the subarray 120 surrounded by dashed lines in FIG. 2 are selected.

In this case, according to Example 1 as is different from conventional memory devices, the time of applying an activation signal to the selection gate signal line $SGY_{00}$ is slightly delayed from the time of activating the word lines WL and the reference word lines REFWL by a scanning signal from a word line decoder circuit (not shown).

FIG. 3 shows the voltage transition of the main bit line MBL and the sub-bit line $SBL_1$ corresponding to the selected memory cell 1. The voltage transition will be described below by paying attention on the input ends 9a and 9b (P0, N0) of the differential sense amplifier 9 until the sense activation signals SAE and /SAE are activated.

As to MBL and /MBL in FIG. 3, the bottom line indicating the main bit line MBL "0" shows the voltage transition of the main bit line MBL when the value of information stored in the memory cell 1 is "0". The top line indicating the main bit line MBL "1" shows the voltage transition of the main bit line MBL when the value of information stored in the memory cell 1 is "1".

As to SBL and /SBL in FIG. 3, the bottom line indicating the sub-bit line SBL "0" shows the voltage transition of the sub-bit line SBL when the value of information stored in the memory cell 1 is "0". The top line indicating the sub-bit line SBL "1" shows the voltage transition of the sub-bit line SBL when the value of information stored in the memory cell 1 is "1".

As to MBL, /MBL, SBL, and /SBL in FIG. 3, the voltage transition of the complementary main bit line /MBL and the complementary sub-bit line $SBL_2$ corresponding to the selected reference cell 10 is shown in FIG. 3. Specifically, an intermediate line between the top line and the bottom line, which indicates /MBL, shows the voltage transition of the complementary main bit line /MBL. An intermediate line between the top line and the bottom line, which indicates /SBL, shows the voltage transition of the complementary sub-bit line /$SBL_1$. Thus, as to MBL, /MBL, SBL, and /SBL in FIG. 3, the top and bottom lines and the intermediate line do not intersect, unlike conventional memory devices.

Therefore, voltage inversion does not occur between the voltage at the reference side and the voltage at the read bit side, so that an improper data read operation is not likely to occur at the time when a sense operation is activated.

In Example 1, the time of activating the selection gate signal $SGY_{00}$ is slightly delayed from the time of activating the word line $WL_1$ and the reference word line REFWL. Precharge for redistributing electric charge, reading cell information, and reading reference information are performed in response to a signal simultaneously applied to the main bit line MBL side and the complementary main bit line /MBL side. Therefore, after switching on the selection gate, voltage inversion does not occur between the two main bit lines MBL and /MBL. Thereby, a main bit line on which electric charge has been accumulated and a sub-bit line from which electric charge has been discharged are short-circuited, and is precharged by redistributing electric charge, and thereafter, current is applied to a memory cell 1 so that information can be read from the memory cell 1 at a high speed and in a stable manner.

The operations performed up until sense activation have been so far described. At the same time as the sense activation (the time of the rising of the sense activation signal SAE), a signal /SEP for disconnecting the differential sense amplifier 9 from the main bit lines MBL and /MBL goes the low level, so that the differential sense amplifier 9 is disconnected from the main bit lines MBL and /MBL. Further, the selection gate signal $SGY_{00}$ goes the low level, so that the main bit lines MBL and /MBL are disconnected from the sub-bit lines SBL and /SBL. Thereafter, the main bit line precharge signal /$PRC_1$ goes the low level, so that the precharging of the main bit lines MBL and /MBL is initiated. At the same time, the sub-bit line reset signal $RS_{00}$ goes the high level, so that the discharging of the sub-bit lines SBL and /SBL is initiated.

By controlling each signal line, the sense operation at the differential sense amplifier 9 side and the precharging and discharging of the main bit lines MBL and /MBL and the sub-bit lines SBL and /SBL can be simultaneously performed. Therefore, the cycle time can be reduced, thereby improving the data transfer rate.

As is seen from the timing chart of FIG. 3, a series of operations for data read includes opening the selection gate, redistributedly precharging electric charge, and a cell information reading integration period. Thereafter, precharging is conducted again, although the selection gate was once opened and data is not required in this cycle. Unless the second precharging is not fully conducted, it becomes impossible to read information in the next cycle.

The control section 150 has a section 151 for canceling information reading. This canceling section 151 is used to prohibit the control of switching of the selection gates immediately after receiving a request for canceling. In this case, an abort process is prepared, so that the selection gate 4 can be canceled at high speed.

When a memory is used for instruction, addresses for accessing the memory are relatively continuous. However, an address for a conditional jump or the like leaps. In this case, access to an unnecessary address is canceled partway. However, for access to the address data of the next new address, the previous precharge time is an overhead. To avoid this overhead as much as possible, it is necessary to effectively cancel the access before precharging is required again, i.e., the selection gate 4 is opened. Therefore, the canceling section 151 for transferring a command for canceling directly to the selection gate 4, and prohibiting selection of a selection gate is provided. As a result, when data access is canceled, the overhead of time required for a next access is reduced.

EXAMPLE 2

Figure 4:
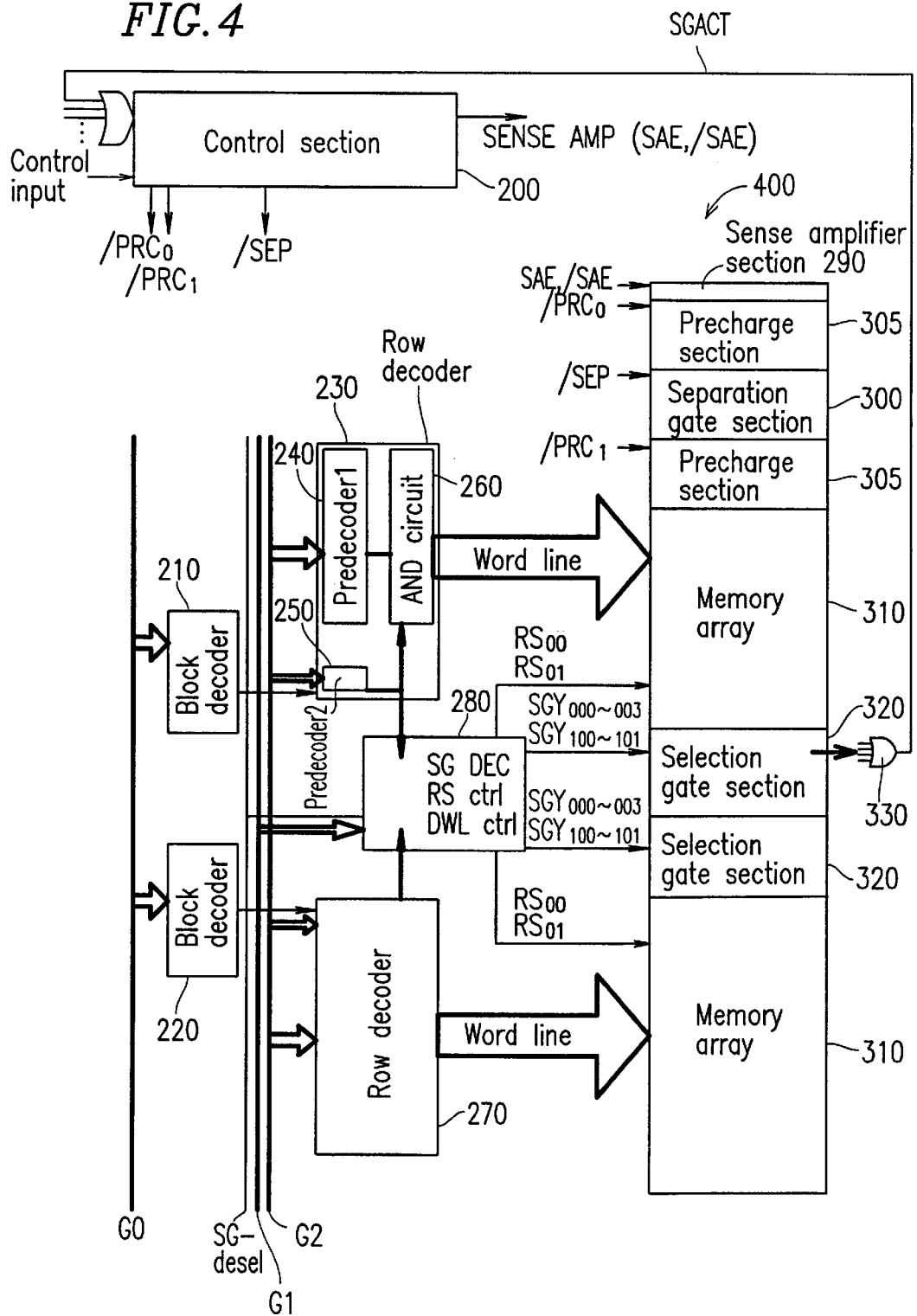
FIG. 4 is a block diagram showing a major portion of a configuration of a semiconductor memory device according to Example 2 of the present invention.
Figure 5:
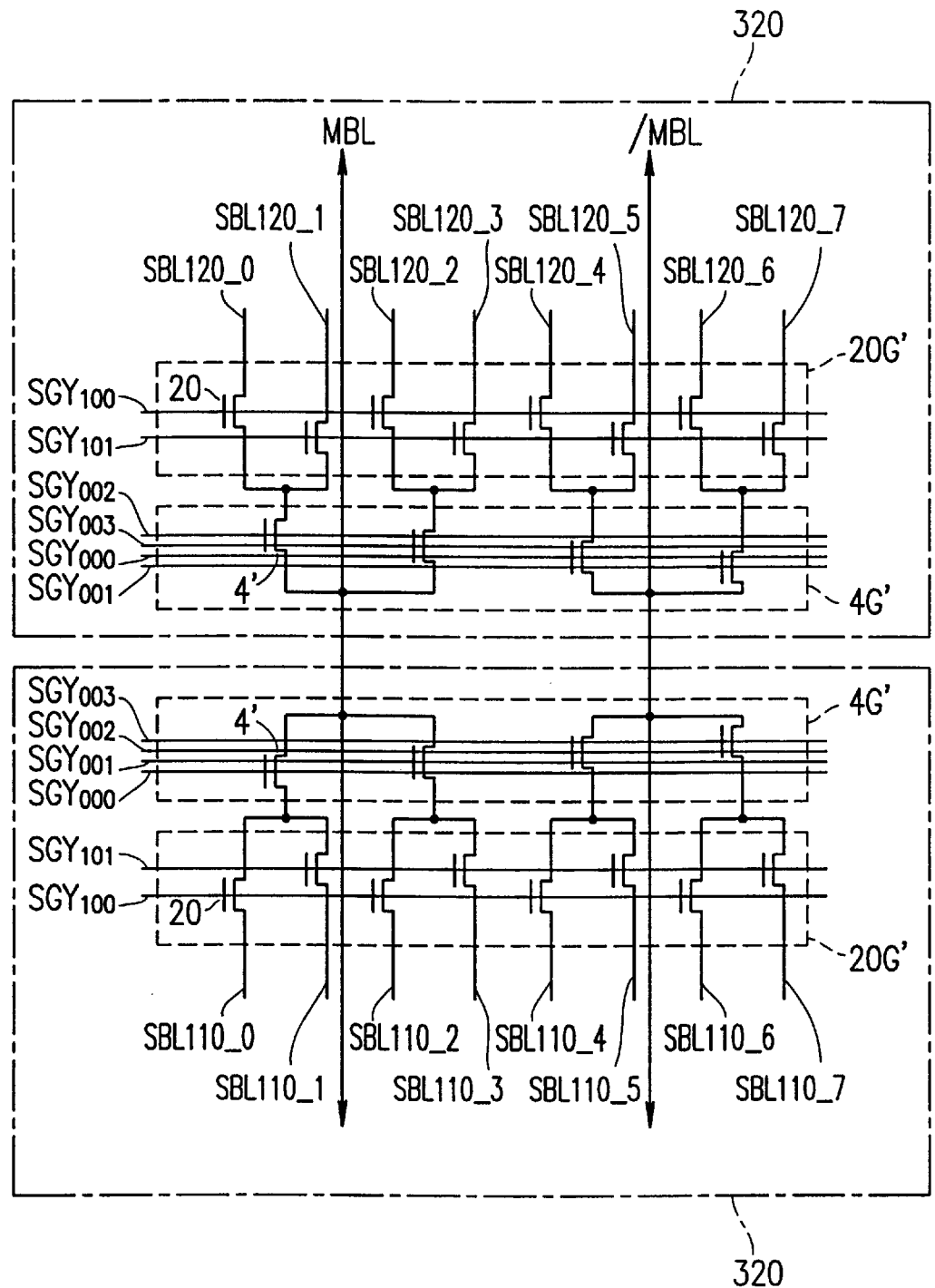
FIG. 5 is a circuit diagram showing a detailed configuration of a selection gate section for connecting a main bit line and a sub-bit line in FIG. 4.

Hereinafter, a semiconductor memory device according to Example 2 of the present invention will be described with reference to FIGS. 4 through 6. In FIGS. 4 and 5, the memory section of FIG. 1 is simplified (a sector portion at the top side of FIG. 1 is omitted, and a detailed configuration inside the sector is omitted.), and the control section 150 of Example 1 is mainly described in terms of control of the entire device (a control section 200) and control of each sector (a sector control circuit 280), where control of a selection gate is concentrated (reset control and reference control are omitted).

FIG. 4 is a block diagram showing a major portion of a configuration of the semiconductor memory device of Example 2.

In FIG. 4, the sector control circuit 280 (SG DEC RS ctrl DWL ctrl) is provided for each sector. The sector control circuit 280 selectively outputs a selection gate signal onto selection gate signal lines $SGY_{000}$ through $SGY_{003}$ and $SGY_{100}$ and $SGY_{101}$. A selection gate activation detecting circuit 330 is provided at the other end of a memory array. A selection gate activation signal from the selection gate activation detecting circuit 330 is input to the control section 200 which in turn outputs sense activation signals SAE and /SAE for controlling activation of a sense amplifier section 290.

An address signal group $G_0$ is input to sector selection block decoders 210 and 220, and the address signal group $G_0$ is decoded. Based on the decoded signal output from the sector selection block decoders 210 and 220, Row decoders 230 and 270 (ROW DEC block) are activated.

The row decoder 230 is provided with a predecoder 240 (predecoder 1) and a predecoder 250 (predecoder 2) which decode respective portions of an address signal group $G_2$. The decoding results are subjected to logical multiplication by an AND circuit 260 (logical multiplication circuit), and the result is output as a scanning signal (word line signal) to the word lines WL. The row decoder 270 has the same configuration as the row decoder 230.

In a typical memory, a predecoder signal is used for decoding in order to reduce a decoder pitch. Further, in a flash memory, a high voltage is required for a word line voltage. Therefore, these decoders comprise high voltage resistant transistors, and a level shifter for an input side voltage and a high voltage drive for information write and the like.

A signal from the predecoder 250 in the row decoder block 230 is input to the sector control circuit 280 provided for each sector. With this signal input to the sector control circuit 280, both a selection gate signal SGY of an upper memory plane and a selection gate signal SGY of a lower memory plane are simultaneously activated in the sector control circuit 280.

FIG. 5 shows a detailed configuration of a selection gate section 320 for connecting a main bit line with a sub-bit line in FIG. 4.

In FIG. 5, in order to obtain a large ratio of the number of connected main bit lines MBL and the number of connected sub-bit lines SBL, the selection gate section 320 has a selection gate group 4G' comprising the selection gates 4' and a selection gate group 20G' comprising selection gates 20. These gates constitute a hierarchical two stage structure. The first half and second half of the sub-bit lines are connected in a two-stage manner via selection gates 4' and 20 (transfer gate) to 8 sub-bit lines $SBL_{110\_0}$ through $SBL_{110\_7}$ for a sector constituting a memory array 310 for the main bit line MBL and the complementary main bit line /MBL. Similarly, the first half and second half of the sub-bit lines are connected in a two-stage manner via selection gates 4' and 20 (transfer gate) to 8 sub-bit lines $SBL_{120\_0}$ through $SBL_{120\_7}$ for a sector constituting another memory array 310 for the main bit line MBL and the complementary main bit line /MBL. The two-stage transfer gate is controlled by a voltage output to the main bit line side selection gate signal lines $SGY_{000}$ through $SGY_{003}$ and the sub-bit line side election gate signal lines $SGY_{100}$ and $SGY_{101}$. With each predecoded signal, only one of the main bit line side selection gate signal lines $SGY_{000}$ through $SGY_{003}$ and only one of the sub-bit line side election gate signal lines $SGY_{100}$ and $SGY_{101}$ selectively go the high level, so that one of the sub-bit lines SBL connected to the main bit line MBL is selected in each sector.

For example, when the main bit line side selection gate line $SGY_{000}$ and the sub-bit line side selection gate line $SGY_{100}$ are selected, a sub-bit line $SBL_{110\_0}$ in the sector and a sub-bit line $SBL_{120\_4}$ in another sector are selected and are connected to the main bit line MBL and the complementary sub-bit line /MBL, respectively.

Figure 6:
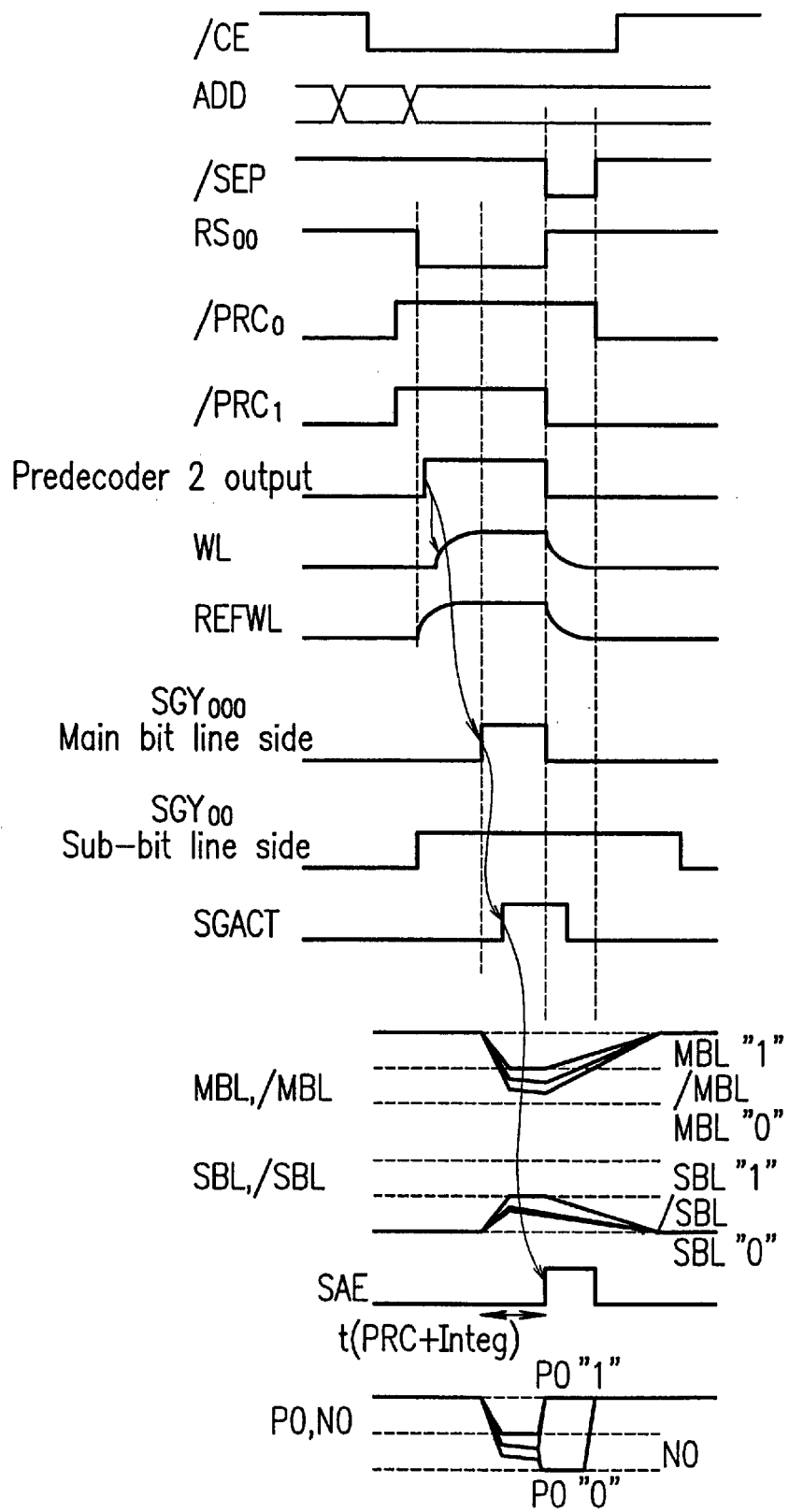
FIG. 6 is a timing chart of signals of major portions of the semiconductor memory device of FIG. 4.

FIG. 6 shows an operational sequence of the above-described configuration. Example 2 differs from Example 1 in the following points. In each signal line, an output signal from the predecoder 250, a selection gate signal to the main bit line side selection gate signal line $SGY_{000}$ (first stage selection gate 4'), a selection gate signal to the sub-bit line side selection gate signal line $SGY_{100}$ (second stage selection gate 20), and a selection gate detection signal SGACT are additionally provided.

Hereinafter, an operation after an address signal has been input will be described in sequence.

Initially, a chip activation signal /CE is input, and sense activation signals SAE and /SAE to the sense amplifier section 290, and precharge signals /$PRC_0$ and /$PRC_1$ to the main bit line MBL are inactivated, so that the main bit lines MBL and /MBL which have been precharged to the power source voltage Vdd are caused to go into a floating state.

Next, in response to an address signal ADD, the block decoder 210 is activated, a sub-bit line reset signal $RS_{00}$ of a sector is off, a sub-bit line on the off side of sub-bit lines having a ground level is caused to go into a floating state.

In response to the address signal ADD, the row decoder 230, the predecoder 240, and the predecoder 250 are activated, so that the potential of the word line WL goes high. The reference word line REFWL of a complementary sector to be accessed does not require rewrite, so that the potential thereof goes high earlier than the word line WL.

On the other hand, a high voltage is not used for the selection gates 4' and 20, so that a selection gate signal goes high earlier than the word line WL unless otherwise modified. However, in the sector control circuit 280, the above-described appropriate delay having no potential inversion is given by the sector control circuit 280 controlled by a signal from the predecoder 250, so that the main bit line side selection gate line $SGY_{000}$ is activated. The sub-bit line side selection gate line $SGY_{100}$ is activated without a delay in accordance with an address signal.

By using a signal from the predecoder 250 in each sector, a selection gate signal is activated from a signal which occurs at a time very close to the rising of the potential of the word line WL, so that a selection gate signal having a reduced delay margin can be obtained. Therefore, higher speed information reading can be achieved.

Further, when the timing of the delay is adjusted at the main bit line side selection gate 4', redistributed precharging of electric charge can be initiated by a signal whose potential goes high earlier with a load capacity being small, resulting in a high-speed sense operation. It should be noted that the main bit line MBL side selection gate and the sub-bit line SBL side selection gate have substantially the same transfer gate size. The number of transistors connected to each signal line is greater at the sub-bit line SBL side.

Next, the main bit line side selection gate line $SGY_{000}$ is activated, so that redistributed precharging of electric charge and a cell information read accumulation period are initiated. After a predetermined time, a sense activation is initiated. In this case, an output from the selection gate signal activation detecting circuit 330 of the previous main bit line side selection gate line $SGY_{000}$ is output to the control section 200. Based on the signal, the sense activation signals SAE and /SAE are output so as to initiate sense activation. Thereby, the cell information reading accumulation period can be accurately obtained, thereby making it possible to secure the accurate timing of performing a high-speed sense operation.

By the operations described above, a sense operation is activated. At the same time of the sense activation, the differential sense amplifier 9 and the main bit line MBL are disconnected from the main bit line MBL and the sub-bit line SBL, respectively when the separation signal /SEP is lowly active and the main bit line side selection signal line $SGY_{000}$ is lowly active. At the same time, the main bit line precharge signal $/PRC_1$ is lowly active and the sub-bit line reset signal is highly active, so that in the sense amplifier section 290 performs a sense operation, the main bit line MBL is precharged, and the sub-bit line SBL is discharged. In this case, the sub-bit line side selection gate signal is maintained at the high level for a certain time. Thereby, the electric charge of the floating capacity between the selection gate 4' and the selection gate 20 connected in series is discharged by a sub-bit line SBL side reset transistor, so that the residual electric charge of the sub-bit line SBL is eliminated before electric charge redistributed precharging is performed. Therefore, a more accurate sense operation can be performed.

Thus, according to the above-described semiconductor memory device of the present invention, a first input end and a main bit line are precharged to a first voltage, and a sub-bit line is reset to a second voltage. Thereafter, a portion of the electric charge precharged in the first input end and the main bit line is redistributed to the sub-bit line. In this read method, until after potential inversion occurs between the main bit line and a complementary main bit line, the time of activating a selection gate is delayed from the times of activating a word line and a reference word line. Therefore, performance of an accurate sense operation can be secured, so that information can be accurately read from the memory cells without error.

According to the semiconductor memory device of the present invention, until after potential inversion occurs between a main bit line and a complementary main bit line due to a time lag between a word line and a reference word line, the time of activating a selection gate is delayed from the times of activating a word line and a reference word line. Therefore, performance of an accurate sense operation can be secured, so that information can be accurately read from the memory cells without error.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:

memory cells;

reference cells;

sub-bit lines, at least the memory cells or the reference cells being connected to the sub-bit lines;

a first selection gate;

a second selection gate;

a main bit line, the sub-bit lines being connected via the first selection gate to the main bit line;

complementary sub bit lines, at least the other of the memory cells and the reference cells being connected to the complementary sub-bit line;

a complementary main bit line, the complementary sub-bit lines being connected via the second selection gate to the complementary main bit line;

word lines corresponding to the memory cells;

reference word lines corresponding to the reference cells;

a word line driving section for selectively activating at least one of the word lines;

a reference word line driving section for selectively activating at least one of the reference word lines; and a control section for outputting a selection gate signal to the first and second selection gates, the selection gate signal activating the first and second selection gates, the time of activating the first and second selection gates being delayed from the time of activating the word lines and the reference word lines to an extent that potential inversion does not occur between the main bit line and the complementary main bit line, wherein information is read from the memory cells via the main bit line and the complementary main bit line.

2. A semiconductor memory device according to claim 1, further comprising a differential sense amplifier comprising first and second input ends, for sensing a difference in voltage between the first and second input ends, a precharge section for precharging the main bit line and the complementary main bit line to a first voltage, and a reset section for resetting the sub-bit lines and the complementary sub-bit lines to a second voltage lower than the first voltage, and releasing the reset state of one of the sub-bit lines and releasing the reset state of one of the complementary sub-bit lines, wherein the main bit line is connected to the first input end, the complementary main bit line is connected to the second input end, the first selection gate selectively connects the main bit line to one of the sub-bit lines, and the second selection gate selectively connects the complementary main bit line to one of the complementary sub-bit lines, and wherein the control section controls the differential sense amplifier, the precharge section, the reset section, and the selection gate section so that the main bit line and the complementary main bit line are precharged to the first voltage, the sub-bit lines and the complementary sub-bit lines are reset to the second voltage in advance, and after selectively releasing the reset state of one of the sub-bit lines and one of the complementary sub-bit lines, a portion of electric charge precharged in the main bit line is redistributed to the reset-state released sub-bit line via the first selection gate, and a portion of electric charge in the complementary main bit line is redistributed to the reset-state released complementary sub-bit line via the second selection gate, and thereafter a sense operation is performed.

3. A semiconductor memory device according to claim 2, wherein a plurality of subarrays are arranged in a direction along the main bit line and the complementary main bit line, each subarray comprising a memory cell array comprising the memory cells, a reference cell array comprising the reference cells, the reset section, and the selection gate section.

4. A semiconductor memory device according to claim 1, further comprising a differential sense amplifier comprising first and second input ends, for sensing a difference in voltage between the first and second input ends, a first separation gate for connecting or disconnecting the first input end and the main bit line, a second separation gate for connecting or disconnecting the second input end and the main bit line, the complementary main bit line being connected via the second separation gate to the second input end, a precharge section for precharging the main bit line and the complementary main bit line to a first voltage, and a reset section for resetting the sub-bit lines and the complementary sub-bit lines to a second voltage lower than the first voltage, and releasing the reset state of one of the sub-bit lines and releasing the reset state of one of the complementary sub-bit lines, wherein the main bit line is connected via the first separation gate to the first input end, the first selection gate selectively connects the main bit line to one of the sub-bit lines, and the second selection gate selectively connects the complementary main bit line to one of the complementary sub-bit lines, and wherein the control section controls the precharge section, the reset section, and the selection gate section so that the main bit line and the complementary main bit line are precharged to the first voltage, the sub-bit lines and the complementary sub-bit lines are reset to the second voltage in advance, and after selectively releasing the reset state of one of the sub-bit lines and one of the complementary sub-bit lines, a portion of electric charge precharged in the main bit line is redistributed to the reset-state released sub-bit line via the first selection gate, and a portion of electric charge in the complementary main bit line is redistributed to the reset-state released complementary sub-bit line via the second selection gate, and thereafter a sense operation is performed, and thereafter, at the same time as or immediately after initiating a sense operation of the differential sense amplifier, the control section controls the first separation gate to disconnect the first input end and the main bit line and the second separation gate to disconnect the second input end and the complementary main bit line, and disables the first and second selection gate so that the main bit line and the complementary bit line are precharged, and the sub-bit line and the complementary bit line are discharged.

5. A semiconductor memory device according to claim 4, wherein a plurality of subarrays are arranged in a direction along the main bit line and the complementary main bit line, each subarray comprising a memory cell array comprising the memory cells and a reference cell array comprising the reference cells, the reset section, and the selection gate section.

6. A semiconductor memory device according to claim 1, wherein at least one of the memory cells and at least one of the reference memory cells are connected to each sub-bit line, and at least one of the memory cells and at least one of the reference memory cells are connected to each complementary sub-bit line.

7. A semiconductor memory device according to claim 1, wherein connecting the main bit line to the sub-bit lines via the first selection gate and connecting the complementary main bit line to the complementary sub-bit lines via the second selection gate are performed in response to a scanning signal for selecting the word lines or an address signal to be decoded to the scanning signal.

8. A semiconductor memory device according to claim 7, wherein the control section determines the time of activating the differential sense amplifier for a sense operation in response to the scanning signal from the word line driving section or the address signal to be decoded to the scanning signal.

9. A semiconductor memory device according to claim 1, wherein the control section determines the time of activating the differential sense amplifier for a sense operation in response to the scanning signal from the word line driving section or the address signal to be decoded to the scanning signal.

10. A semiconductor memory device according to claim 1, wherein the first and second selection gates each comprise a first-stage selection gate and a plurality of second-stage selection gates, the first selection gate is provided between the main bit line and the sub-bit lines and the second selection gate is provided between the complementary main bit line and the complementary sub-bit lines, the plurality of second-stage selection gates are hierarchically branched from the first-stage selection gate, and the control section deliberately delays the time of switching on the first-stage selection gate.

11. A semiconductor memory device according to claim 1, wherein the first and second selection gates each comprise a first-stage selection gate and a plurality of second-stage selection gates, the first selection gate is provided between the main bit line and the sub-bit lines and the second selection gate is provided between the complementary main bit line and the complementary sub-bit lines, the plurality of second-stage selection gates are hierarchically branched from the first-stage selection gate, and the control section switches on the second-stage selection gates a predetermined time earlier than that of the first-stage selection gate, and after a predetermined time, switches off the first-stage selection gate earlier than that of the second-stage selection gates.

12. A semiconductor memory device according to claim 1, wherein the control section has a canceling section for canceling information reading, and the canceling section prohibits control of switching on the first and second selection gates.

* * * * *